United States Patent
Linliu

(10) Patent No.: US 6,180,483 B1
(45) Date of Patent: Jan. 30, 2001

(54) STRUCTURE AND FABRICATION METHOD FOR MULTIPLE CROWN CAPACITOR

(75) Inventor: Kung Linliu, Hsinchu (TW)

(73) Assignee: Worldwide Semiconductor Manufacturing Corp., Hsinchu (TW)

( * ) Notice: Under 35 U.S.C. 154(b), the term of this patent shall be extended for 0 days.

(21) Appl. No.: 09/371,728

(22) Filed: Aug. 10, 1999

(30) Foreign Application Priority Data

Jun. 3, 1999 (TW) ................................................ 88109187

(51) Int. Cl.$^7$ ............................. H01L 21/20; H01L 82/42
(52) U.S. Cl. ......................... 438/396; 438/397; 438/398; 438/253; 438/354; 438/255; 257/306
(58) Field of Search .................................... 438/396, 397, 438/398, 253, 254, 255

(56) References Cited

U.S. PATENT DOCUMENTS

| | | | | |
|---|---|---|---|---|
| 5,279,983 | * | 1/1994 | Ahn | 437/52 |
| 5,364,809 | * | 11/1994 | Kwon et al. | 437/52 |
| 5,854,105 | * | 12/1998 | Tseng | 438/253 |
| 5,933,742 | * | 8/1999 | Wu | 438/398 |
| 6,087,216 | * | 7/2000 | Wang | 438/253 |

* cited by examiner

Primary Examiner—Steven Loke
Assistant Examiner—Nitin Parekh
(74) Attorney, Agent, or Firm—Jiawei Huang; J C Patents

(57) ABSTRACT

A multiple crown capacitor and a method of fabricating such a capacitor is described. The method is applicable to a substrate in which an isolation layer is formed on the substrate, with a node contact plug formed in the isolation layer. A sacrificial layer is then formed on the substrate followed by a patterning of the sacrificial layer to form a succession of openings above the node contact plug and its surroundings, exposing the isolation layer and a portion of the node contact plug upper surface. Thereafter, a conformal conductive layer is formed on the sacrificial layer and in the openings. A portion of the conductive layer, which is higher than the sacrificial layer, is removed, followed by removing the sacrificial layer to form a bottom electrode. A conformal dielectric layer and an upper electrode are sequentially formed on the bottom electrode to complete the formation of the capacitor. The structure of the capacitor includes a bottom electrode, which comprises a succession of openings on the upper surface of the bottom electrode. The bottom electrode is located on the node contact plug and is electrically connected to the node plug. A conformal dielectric layer and an upper electrode are sequentially formed on the bottom electrode.

14 Claims, 4 Drawing Sheets

STRUCTURE AND FABRICATION METHOD FOR MULTIPLE CROWN CAPACITOR

CROSS-REFERENCE TO RELATED APPLICATION

This application claims the priority benefit of Taiwan application Ser. No. 88109187, filed Jun. 3, 1999, the full disclosure of which is incorporated herein by reference.

BACKGROUND OF THE INVENTION

1. Field of the Invention

The present invention relates to a structure and a fabrication method for a semiconductor device. More particularly, the present invention relates to a structure and a fabrication method for a multiple crown capacitor in a dynamic random access memory (DRAM) cell.

2. Description of the Related Art

The capacitor is the center for signal storage in a DRAM cell. As the amount of charge being stored by the capacitor is increased, the effect of noise on the information reading, such as soft errors induced by the a particles, and the refresh frequency are greatly reduced.

Increasing the charge storage capacity of a capacitor is generally accomplished by the following methods. Substituting the dielectric layer with a high dielectric constant material increases the charge storage capacity per unit area of the capacitor. Reducing the thickness of the dielectric layer also increases the capacitance of the capacitor. The material properties of the dielectric layer and the current manufacturing technique, however, require a minimum thickness of dielectric layer. Increasing the surface area of the capacitor increases the amount of charge being stored in the capacitor; however, this also lowers the integration of a DRAM device.

The charge storage capacity for a traditional DRAM cell is normally low because a two dimensional capacitor, in another words, the planar-type capacitor, is used in the manufacturing of the integrated circuits. The planar-type capacitor occupies a great amount of the area in the semiconductor substrate designated for charge storage, and is thus not suitable for the design of a highly integrated device. A three dimensional capacitor is required for the highly integrated DRAM cell such as the stacked-type, the trench-type and the crown-type capacitor. As the memory device enters an even higher level of integration, especially in DRAM cells of 64Mb and beyond, however, a simple three dimensional capacitor structure is still not adequate. Hence, methods of increasing the surface area of a dynamic random access memory cell capacitor within a small area are being developed.

SUMMARY OF THE INVENTION

The current invention provides a fabrication method of a multiple crown capacitor for a DRAM cell, which is applicable to a substrate comprising an isolation layer with a node contact plug. This method includes forming a sacrificial layer on the substrate, followed by patterning the sacrificial layer. A succession of openings is formed above the node contact plug and surrounding the node contact plug, exposing the isolation layer and a portion of the node contact plug upper surface. A conformal conductive layer is formed on the patterned sacrificial layer and in the openings. A portion of the conductive layer, which is higher than the sacrificial layer, is removed, followed by removing the sacrificial layer to convert the conductive layer to a multiple crown bottom electrode. A conformal dielectric layer and the upper electrode are then sequentially formed on the bottom electrode to complete the manufacturing of the capacitor.

The present invention further provides a structure of a multiple crown capacitor, which can be used in a DRAM cell device. The structure comprises a substrate with an isolation layer and a node contact plug formed in the isolation layer. A bottom electrode with a succession of openings is formed above the node contact plug and is electrically connected to the node contact plug. A conformal dielectric layer and an upper electrode are sequentially formed on the bottom electrode.

According to the present invention, only one sacrificial layer mask needs to be patterned to complete the manufacturing of the entire capacitor. The manufacturing process of the present invention is not only simple; the resulting capacitor also comprises a greater surface area.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
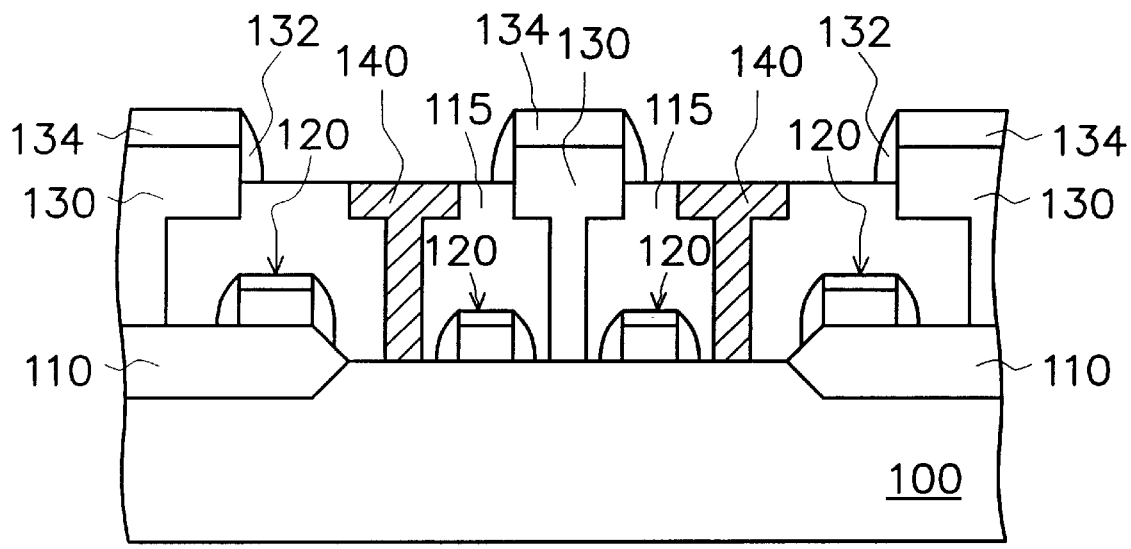
FIGS. 1A to 1E are schematic, cross-sectional views of the manufacturing steps for a triple crown capacitor having a lattice structure according to the preferred embodiment of the present invention.

FIGS. 1A to 1E are schematic, cross-sectional views of the manufacturing steps for a triple crown capacitor having a lattice structure according to the preferred embodiment of the present invention.

Referring to FIG. 1, device isolation structures 110, such as field oxide layers, are formed in a substrate 100. Multiple gates 120 and an isolation layer 115, for example, a silicon oxide layer, are also formed on the substrate 100. In the isolation layer 115, bit lines 130 and node contact plugs 140 are formed. Materials used for the bit lines include polycide, and for the node contact plugs 140 include doped polysilicon. The bit line 130 comprises a roof layer 134 on the top and spacers 132 on the sides. Both the roof layer 134 and the spacers 132 are, for example, silicon nitride.

Figure 1B:
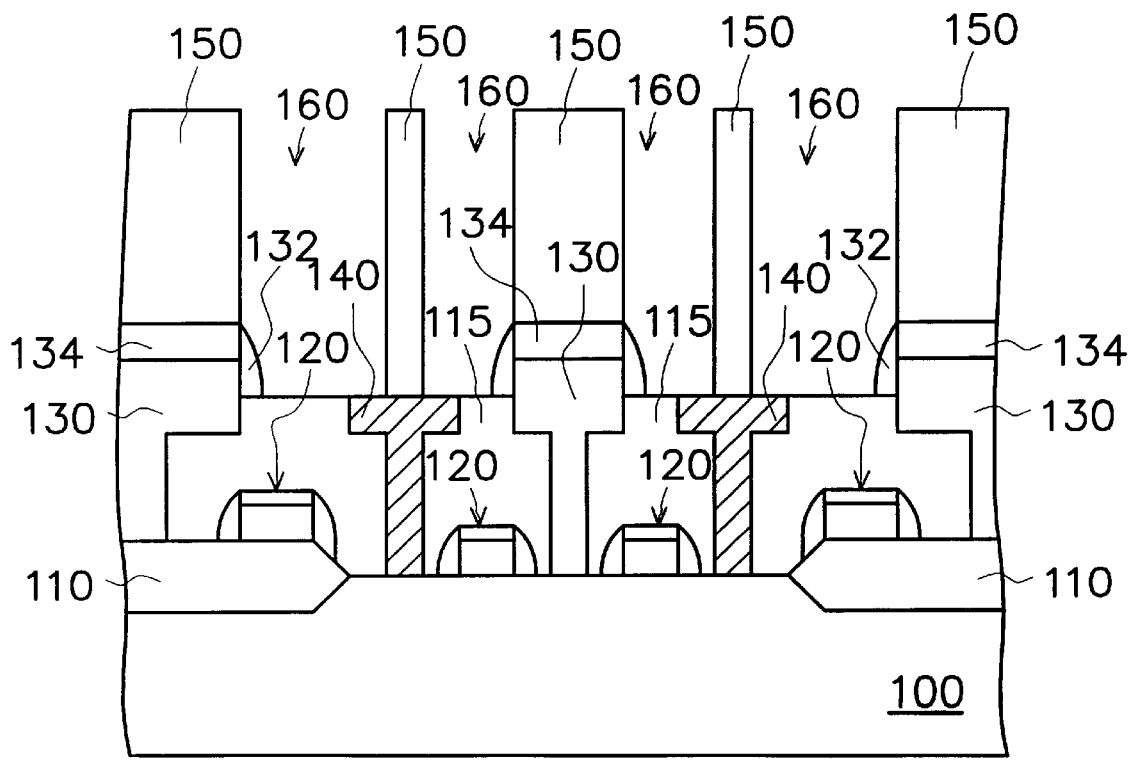

As shown in FIG. 1B, a sacrificial layer 150 is formed on the substrate 100. The sacrificial layer 150, such as silicon oxide, is formed by methods including chemical vapor deposition.

The sacrificial layer 150 is then patterned to form a series of openings 160, on both sides of the node contact plugs 140, exposing the isolation layer 115, a portion of the upper surface of the node contact plugs 140 and the spacers 132. Methods of patterning the sacrificial layer 150 include photolithography and etching techniques. In this etching process, if both the sacrificial layer 150 and the isolation layer 115 are silicon oxide, and the roof layer 134 and the spacers 132 are silicon nitride, a self-aligned etching can be used because the etching ratio of silicon oxide is different from that of silicon nitride. As a result, the bit lines 130 are prevented from being damaged. The etching can be continued until the etching instrument detects the signals for the bit line 130 material, for example, doped polysilicon. The remaining sacrificial layer 150 covers the centers of the node contact plugs 140 and the roof layers 134.

Figure 1C:
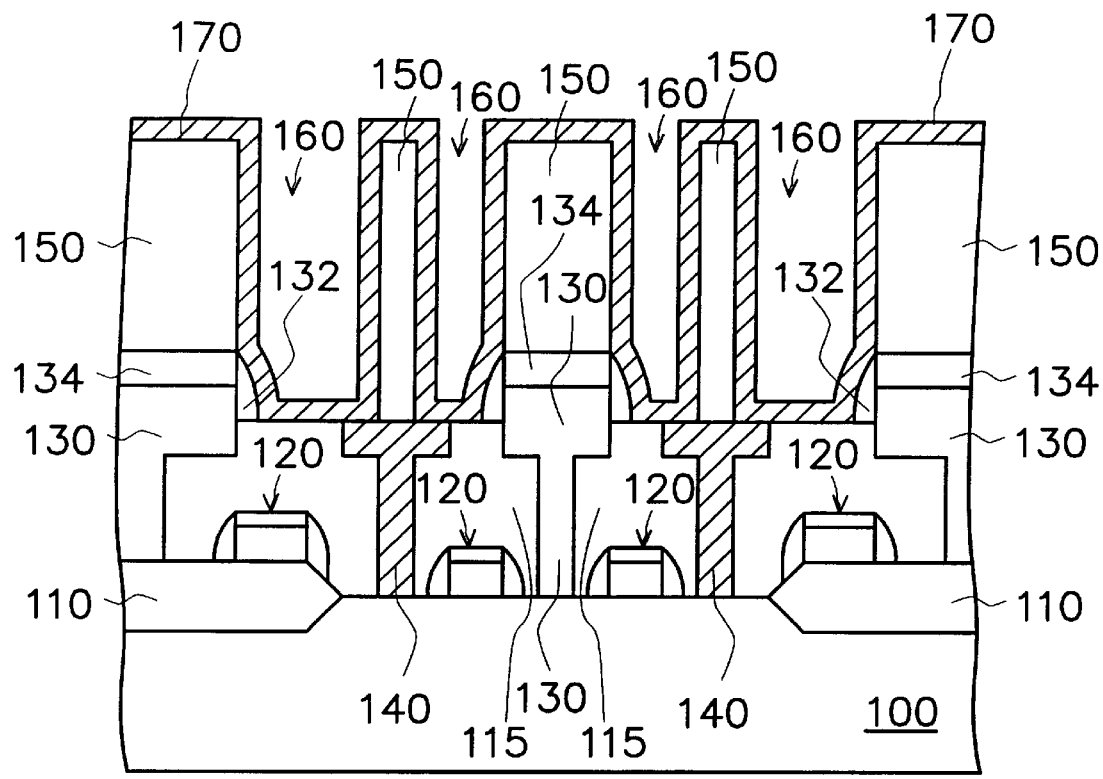
Figure 1D:
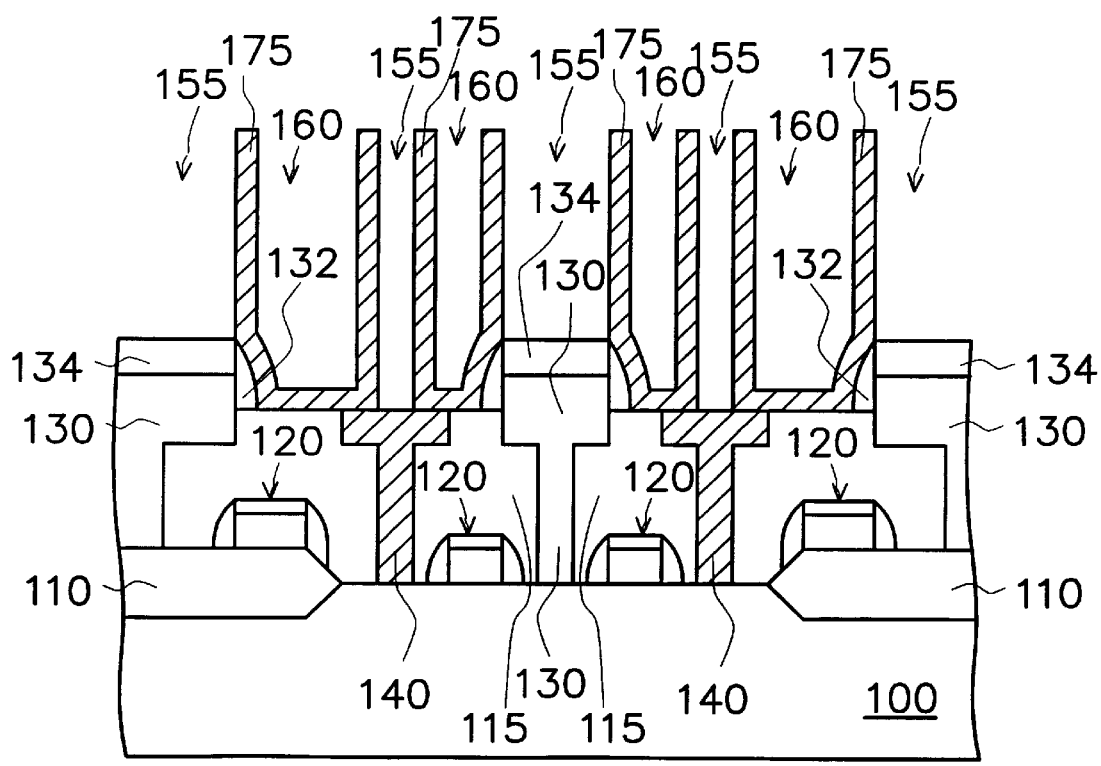

Referring to FIG. 1C, a conformal conductive layer 170 is deposited on the patterned sacrificial layer 150 and in the openings 160. The conductive layer 170, such as doped polysilicon, is formed by methods including chemical vapor deposition.

As shown in Figure ID, a portion of the conductive layer 170, which is higher than the sacrificial layer 150, is removed by methods including etching back or chemical mechanical polishing.

The sacrificial layer 150 is further removed, leaving a series of openings 155 and converting the conductive layer 170 into two triple crown bottom electrode 175. If the sacrificial layer 150 is silicon oxide, the sacrificial layer 150 is removed by methods including etching with a hydrogen fluoride (HF) gas.

Figure 2A:
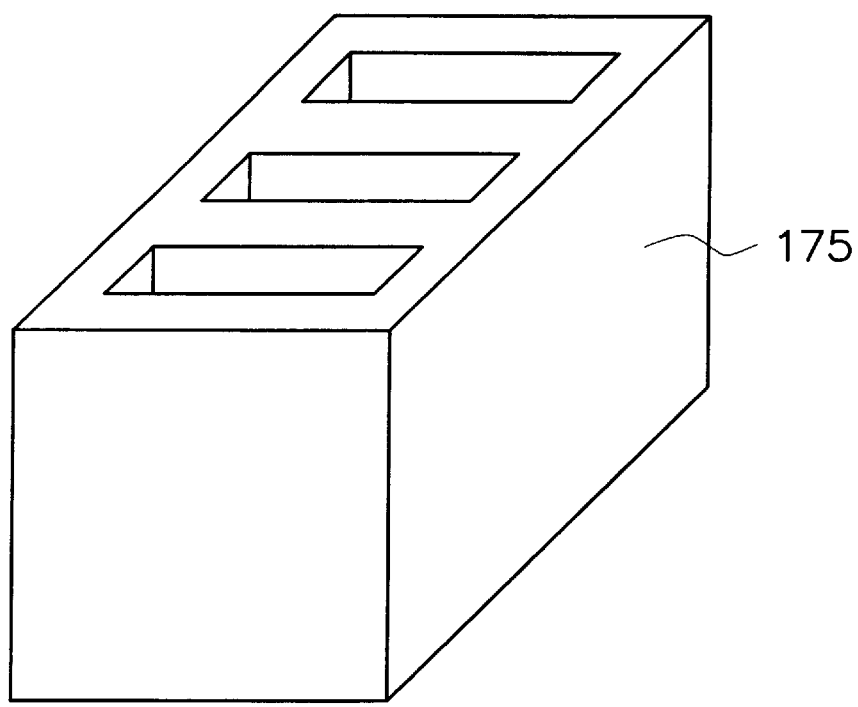
FIGS. 2A to 2B are schematic perspective views of a multiple crown bottom electrode according to the preferred embodiment of the present invention.
Figure 2B:
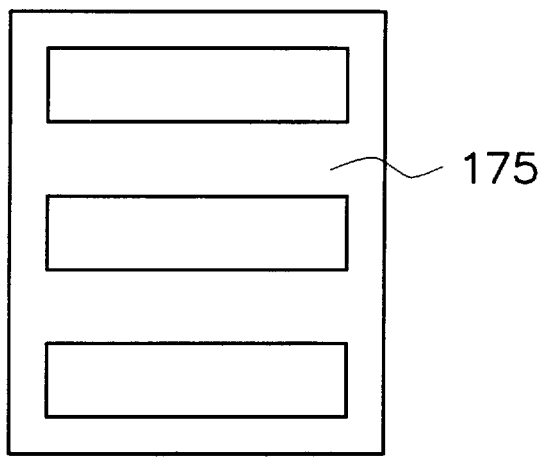

FIGS. 2A and 2B present the overall view of the bottom electrode 175. FIG. 2A is a bird's eye perspective view of the bottom electrode. FIG. 2B is the top view of the bottom electrode.

Figure 1E:
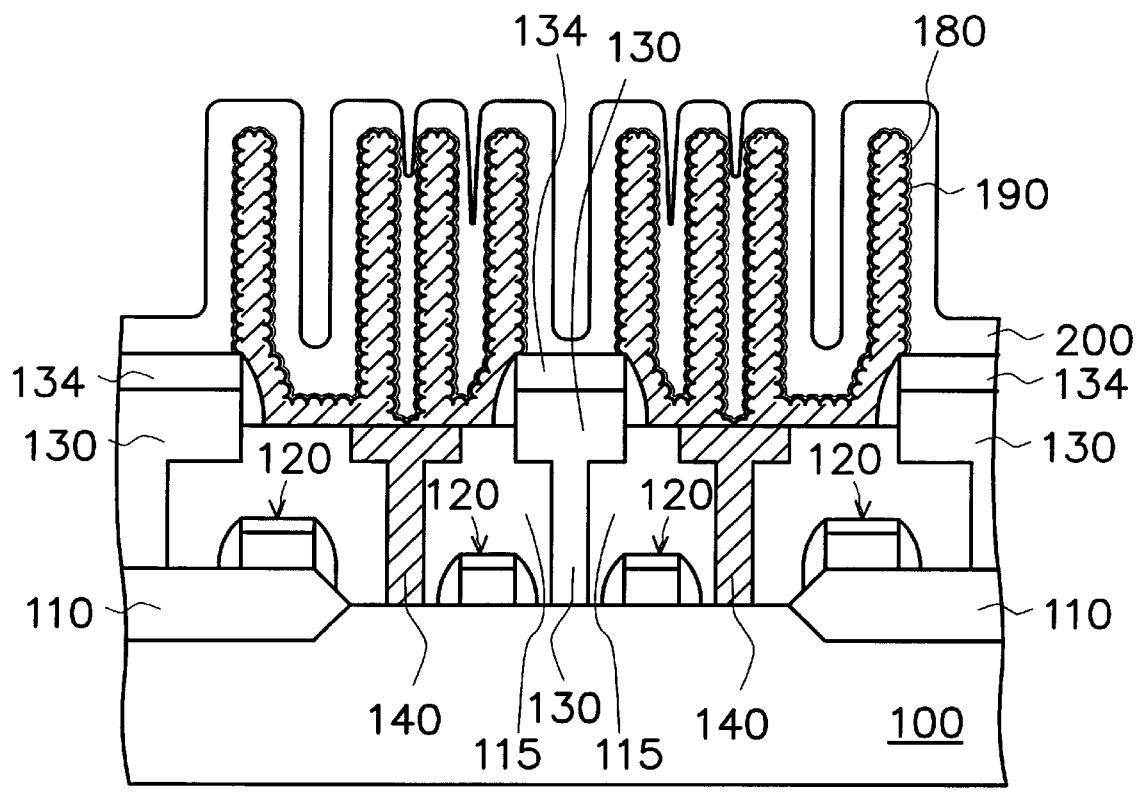

As shown in FIG. 1E, if the bottom electrode 175 is doped polysilicon, hemispherical silicon crystals 180 can be grown on the surface of the bottom electrode 175. A conformal dielectric layer 190 is then formed on the bottom electrode 175, followed by forming a conformal conductive material on the substrate 100 and on the dielectric layer 190. The bottom electrode has a lattice structure from a top view. After patterning the conductive material, a conformal upper electrode 200 is formed. The dielectric layer 190 includes a sandwich layer of silicon oxide/silicon nitride/silicon oxide. Materials used for the upper electrode 200 include doped polysilicon.

The surface area of the capacitor according to the present invention is twice as much as the surface area of a stacked-type capacitor, and is 1.2 times the area of the crown-type capacitor.

Although in the above embodiment, the present invention has been described with respect to a triple crown capacitor having a lattice structure. This invention is also applicable to forming various shapes of patterns as required in the patterning step of the sacrificial layer to increase the surface area of the capacitor.

The present invention comprises at least the following advantages. Only one patterned sacrificial layer mask is needed to define the outer shape of the entire capacitor structure and the process is easy to conduct. A self-aligned etching can be conducted to form the sacrificial layer, and the bit lines are thus prevented from being damaged because the etching ratio of bit line spacers is different than that of the sacrificial layer. The surface area of the capacitor is greatly increased in the current invention; thereby the performance of the DRAM cell is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a triple crown capacitor, which is suitable in the manufacturing of a DRAM cell and applicable to a substrate comprising an isolation layer and a node contact plug formed in the isolation layer, the method comprising the steps of:

forming a sacrificial layer on the substrate;

patterning the sacrificial layer to form an opening on both sides of the node contact plug, exposing the isolation layer and a portion of the node contact plug upper surface;

forming a conformal first conductive layer on the patterned sacrificial layer and in the openings;

removing a portion of the conductive layer which is higher than the sacrificial layer;

removing the sacrificial layer, wherein a remaining portion of the conductive layer forms a first electrode with a series of three openings when viewed from a top;

forming a conformal dielectric layer on the first electrode; and forming a conformal second electrode on the dielectric layer.

2. The fabrication method of a triple crown capacitor according to claim 1, wherein forming the sacrificial layer includes forming a silicon oxide layer by means of chemical vapor deposition.

3. The fabrication method of a triple crown capacitor according to claim 1, wherein removing the sacrificial layer includes etching with a hydrogen fluoride gas.

4. The fabrication method of a triple crown capacitor according to claim 1, wherein removing a portion of the conductive layer above the sacrificial layer includes an etching back procedure.

5. The fabrication method of a triple crown capacitor according to claim 1, wherein removing a portion of the conductive layer above the sacrificial layer includes chemical mechanical polishing.

6. The fabrication method of a triple crown capacitor according to claim 1, wherein the conductive layer surface includes a doped polysilicon layer with hemispherical silicon crystals grown on the doped polysilicon layer.

7. The fabrication method of a triple crown capacitor according the claim 1, wherein the dielectric layer includes a sandwich layer of silicon oxide/silicon nitride/silicon oxide.

8. A fabrication method of a multiple crown capacitor having a lattice structure, which is suitable in the manufacturing of a DRAM cell and applicable to a substrate comprising an isolation layer and a node contact plug formed in the isolation layer, the method comprising the steps of:

forming a sacrificial layer on the substrate;

patterning the sacrificial layer to form a succession of first openings above the node contact plug and its surrounding, exposing the isolation layer and a portion of the node contact plug upper surface;

forming a conformal first conductive layer on the patterned sacrificial layer and in the openings;

removing a portion of the conductive layer which is higher than the sacrificial layer;

removing the sacrificial layer, wherein a remaining portion of the conductive layer forms a first electrode with a succession of second openings when viewed from a forming a conformal dielectric layer on the first electrode; and forming a conformal second electrode on the dielectric layer.

9. The fabrication method of a multiple crown capacitor according to claim 8, wherein the sacrificial layer includes a silicon oxide layer formed by chemical vapor deposition.

10. The fabrication method of a multiple crown capacitor according to claim 9, wherein removing the sacrificial layer includes etching with a hydrogen fluoride gas.

11. The fabrication method a multiple crown capacitor according to claim 8, wherein removing a portion of the conductive layer above the sacrificial layer includes an etching back procedure.

12. The fabrication method of a multiple crown capacitor according to claim 8, wherein removing a portion of the conductive layer above the sacrificial layer includes chemical mechanical polishing.

13. The fabrication method of a multiple crown capacitor according to claim 8, wherein the conductive layer surface includes a doped polysilicon layer with hemispherical silicon crystals grown on the doped polysilicon layer.

14. The fabrication method of a multiple crown capacitor according to claim 8, wherein the dielectric layer includes a sandwich layer of silicon oxide/silicon nitride/silicon oxide.

* * * * *